(12) United States Patent
Demharter et al.

(10) Patent No.: US 7,728,691 B2
(45) Date of Patent: Jun. 1, 2010

(54) MODULATOR FOR RADIO-FREQUENCY SIGNALS

(75) Inventors: Nikolaus Demharter, Dormitz (DE); Philipp Hoecht, Lauf (DE); Martin Nisznansky, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 44 days.

(21) Appl. No.: 12/251,843

(22) Filed: Oct. 15, 2008

(65) Prior Publication Data

US 2009/0096546 A1    Apr. 16, 2009

(30) Foreign Application Priority Data

Oct. 16, 2007    (DE) .................... 10 2007 049 538
Dec. 6, 2007    (DE) .................... 10 2007 058 872

(51) Int. Cl.
*H03C 1/60*    (2006.01)
(52) U.S. Cl. .................... 332/170; 375/308; 332/103; 332/104
(58) Field of Classification Search .............. 332/170, 332/103

See application file for complete search history.

(56) References Cited

U.S. PATENT DOCUMENTS

| 6,621,366 | B1* | 9/2003 | Gentile ................. 332/103 |
| 2003/0174784 | A1* | 9/2003 | Samarasooriya et al. ..... 375/308 |
| 2005/0003785 | A1 | 1/2005 | Jackson et al. |
| 2006/0097814 | A1* | 5/2006 | Schlesinger et al. ........ 332/103 |

FOREIGN PATENT DOCUMENTS

DE    198 28 955 A1    12/1999

* cited by examiner

*Primary Examiner*—Joseph Chang
(74) *Attorney, Agent, or Firm*—Schiff Hardin LLP

(57) ABSTRACT

A modulator for radio-frequency signals designed an entirely digital modulator has two mixer stages connected in series. The first mixer stage implements with a relatively low first sample rate a frequency mixing with a first oscillator frequency that is adjustable with high precision. The second mixer stage implements a frequency mixing with a significantly higher second sample rate and with a relatively coarsely adjustable second oscillator frequency. The downstream second mixer stage, in the case of a single mixer stage, the mixer stage, has at least two phase accumulators that are incremented with the higher second sample rate but with different incremental values. The output signal of at maximum one of the phase accumulators is evaluated at any point in time.

23 Claims, 5 Drawing Sheets

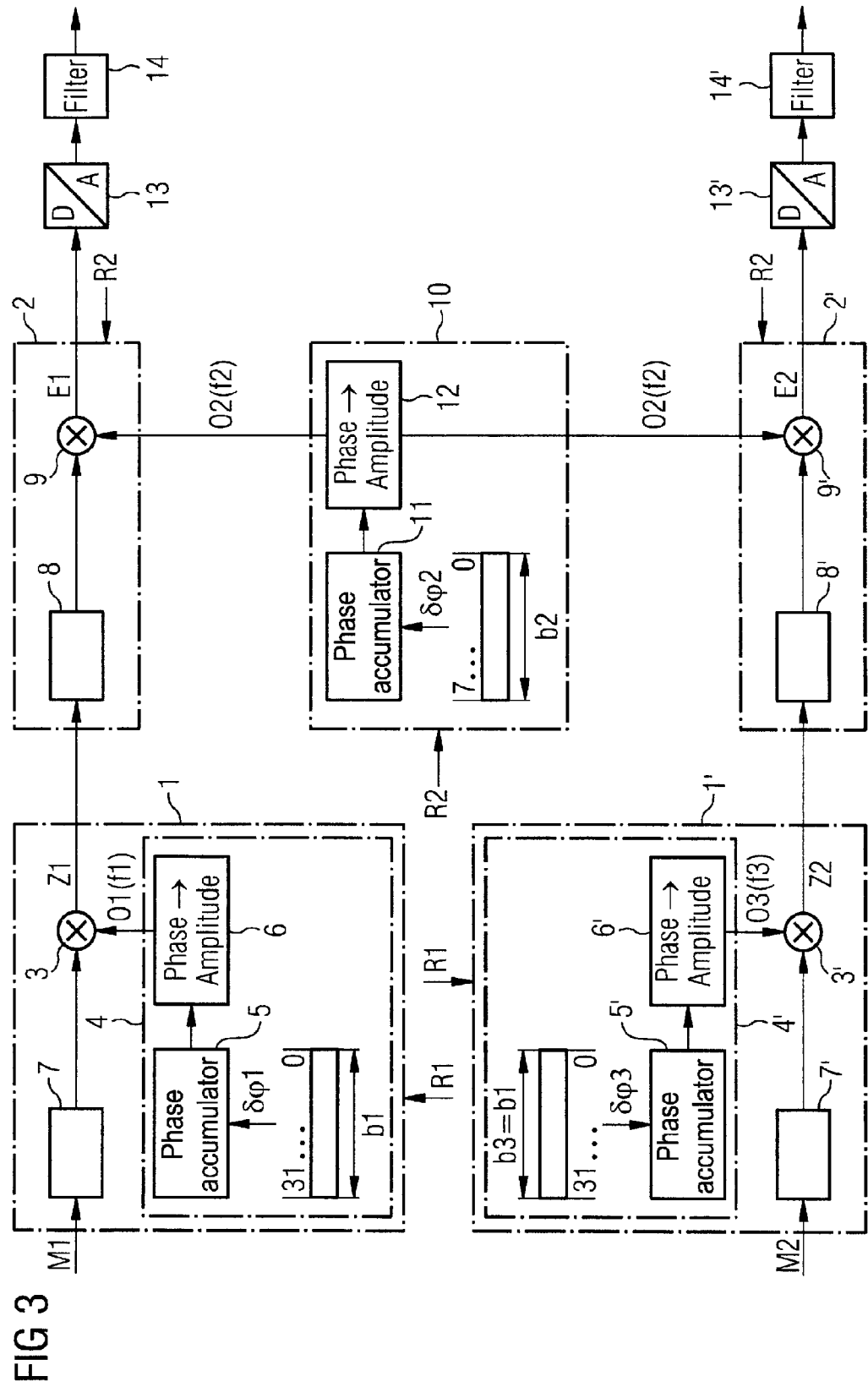

MODULATOR FOR RADIO-FREQUENCY SIGNALS

BACKGROUND

The preferred embodiment concerns a modulator for radio-frequency signals, wherein:
the modulator is designed as a completely digital modulator,
the modulator has a mixer stage,
a modulation signal and an oscillator signal are supplied to the mixer stage a sample rate,
the mixer stage mixes the modulation signal and the oscillator signal into a final signal and outputs the final signal with the sample rate,
the oscillator signal is generated by an oscillator,
the oscillator has a phase accumulator and a phase-amplitude transducer,
the oscillator signal possesses an oscillator frequency,
wherein the oscillator frequency is determined by an incremental value by which the content of the first phase accumulator is incremented between two readout processes in immediate succession,
the incremental value has a bit width.

For example, such a modulator is known from the DAC 5687 by Texas Instruments.

For the operation of magnetic resonance systems, a radio-frequency signal that can be adjusted in frequency and amplitude (also in phase, given pulse series) is required to excite the spins. For this purpose, a low-frequency envelope is normally converted to an intermediate frequency and then to the operating frequency (Larmor frequency) by means of complex modulation to generate a single sideband. For multichannel transmission systems, many individually adjustable radio-frequency signals are required (corresponding to the number of transmission channels). Furthermore, alternating pulses with frequencies differing from one another are sent in what are known as decoupling experiments, wherein the pulses must, however, remain phase-locked relative to one another.

In previous concepts, the low-frequency signal or the intermediate frequency signal is converted into an analog signal, and then the converted signal is translated to the radio-frequency by means of analog single sideband modulation. However, the analog mixer stages require a complicated compensation for the sideband and carrier suppression. Furthermore, precision mixers are required. Both techniques (compensation and use of precision mixers) are very cost-intensive. The corresponding components are required multiple times for multichannel systems, whereby the expenditure and the costs increase even further.

SUMMARY

It is an object to achieve a modulator for radio-frequency signals by means of which a high-precision modulation is enabled in a simple manner.

In a modulator designed as a digital modulator for radio-frequency signals, the following is provided:
a first mixer stage;
a first modulation signal and a first oscillator signal supplied to the first mixer stage with a first sample rate;
the first mixer stage mixing the first modulation signal and the first oscillator signal into a first intermediate signal with the first sample rate;
the first oscillator signal being generated by a first oscillator having a first phase accumulator and a phase-amplitude transducer;
the first oscillator signal having a first oscillator frequency determined by a first incremental value by which a content of the first phase accumulator is incremented between readout processes;
the first incremental value having a first bit width;
the modulator having a first sample rate transducer;
the first intermediate signal being supplied to the first sample rate transducer which outputs the first intermediate signal with a second sample rate greater than the first sample rate;
the modulator having a second mixer stage;
the first intermediate signal and a second oscillator signal being supplied to the second mixer stage with the second sample rate;
the second mixer stage mixing the first intermediate signal and the second oscillator signal into a first final signal which is output with the second sample rate;
the second oscillator signal being generated by a second oscillator having at least one second phase accumulator and a second phase-amplitude transducer;
one of the phase accumulators acting on the phase amplitude transducer;
the second oscillator signal having a second oscillator frequency greater than the first oscillator frequency;
the second oscillator frequency being determined by a second incremental value by which a content of the second phase accumulator acting on the phase-amplitude transducer is incremented between readout processes; and
the second incremental value having a second bit width smaller than the first bit width.

BRIEF DESCRIPTION OF THE DRAWINGS

FIG. 3 shows one possible embodiment of the modulator from FIG. 1;

DESCRIPTION OF THE PREFERRED EMBODIMENT

Figure 1:
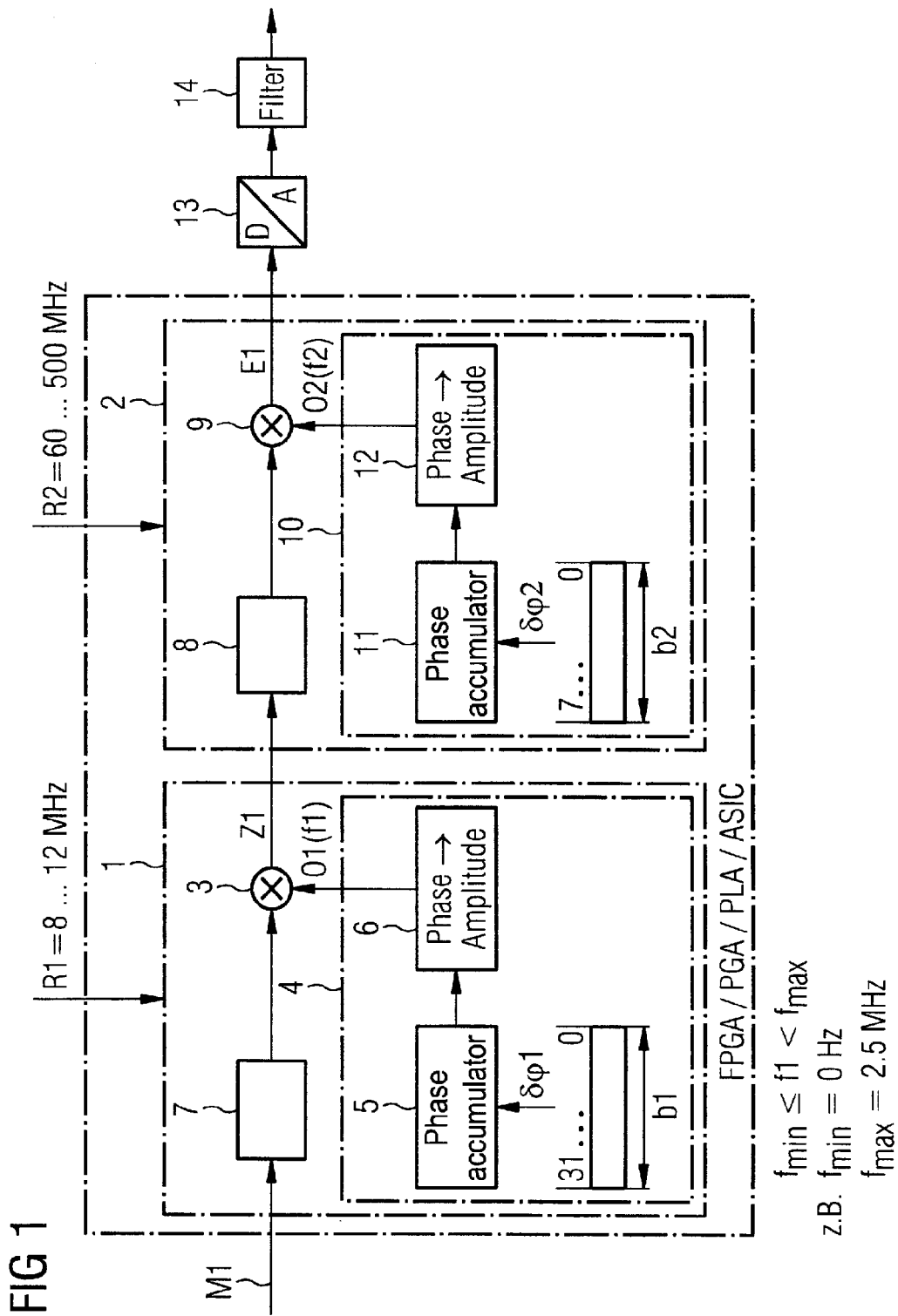
FIG. 1 illustrates schematically, a modulator according to one possible embodiment.

For the purposes of promoting an understanding of the principles of the invention, reference will now be made to the preferred embodiment/best mode illustrated in the drawings and specific language will be used to describe the same. It will nevertheless be understood that no limitation of the scope of the invention is thereby intended, and such alterations and further modifications in the illustrated device and such further applications of the principles of the invention as illustrated as would normally occur to one skilled in the art to which the invention relates are included.

According to a preferred embodiment, the modulator is designed as a completely digital modulator. It has a first mixer stage to which a first modulator signal and a first oscillator signal are supplied with a first sample rate. The first mixer stage mixes the first modulation signal and the first oscillator signal into a first intermediate signal and outputs the first intermediate signal with the first sample rate. The first oscillator signal is generated by a first oscillator. The first oscillator has a first phase accumulator and a first phase-amplitude transducer. The first oscillator signal possesses a first oscillator frequency. The first oscillator frequency is determined by a first incremental value by which the content of the first phase accumulator is incremented between two readout processes in immediate succession. The first incremental value hereby has a first bit width. The modulator furthermore has a first sample rate transducer. The first intermediate signal with the first sample rate is supplied to the first sample rate transducer. It outputs the first intermediate signal with a second sample rate that is greater than the first sample rate. The modulator furthermore possesses a second mixer stage. The first intermediate signal and a second oscillator signal are supplied to the second mixer stage with the second sample rate. The second mixer stage mixes the first intermediate signal and the second oscillator signal into a first final signal and outputs the first final signal with the second sample rate. The second oscillator signal is generated by a second oscillator. The second oscillator has at least one second phase accumulator and a second phase-amplitude transducer. Only one of the phase accumulators acts on the phase-amplitude transducer. The second oscillator signal has a second oscillator frequency that is greater than the first oscillator frequency. The second oscillator frequency is determined by a second incremental value by which the content of the second phase accumulator acting on the phase-amplitude transducer is incremented between two readout processes in immediate succession. The second incremental value has a second bit width that is smaller than the first bit width.

In a preferred embodiment of the present invention, the first mixer stage is designed as a single sideband mixer. An SFDR can be achieved and the interference spectrum is reduced via this procedure.

In a particularly preferred embodiment, the single sideband mixer is designed as a switchable single sideband mixer. Via this embodiment, the single sideband mixer can alternatively be operated as a normal position mixer or as an inverted position mixer.

The second oscillator frequency normally lies in the multi-digit MHz range. The first bit width is advantageously so large that the first oscillator frequency can be adjusted by 1 Hz or even more precisely. In particular, via this procedure it can be possible that the first oscillator frequency can be set so precisely that the modulator is suitable for the generation of radio-frequency pulses for magnetic resonance applications.

In a preferred embodiment of the present invention, the first oscillator frequency can be set between a minimum frequency and a maximum frequency. The second bit width in this embodiment is so large that the second oscillator frequency is adjustable in stages whose intervals from one another are at maximum as large as the maximum frequency. Via this embodiment it is possible to cover a large total frequency range without gaps.

It is possible, that:
the modulator has a third mixer stage,
a second modulation signal and a third oscillator signal are supplied to the third mixer stage with the first sample rate,
the third mixer stage mixes the second modulation signal and the third oscillator signal into a second intermediate signal and outputs the second intermediate signal with the first sample rate,
the third oscillator signal is generated by a third oscillator,
the third oscillator possesses a third phase accumulator and a third phase-amplitude transducer,
the third oscillator signal possesses a third oscillator frequency,
the third oscillator frequency is determined by an incremental value by which the content of the third phase accumulator is incremented between two readout processes in immediate succession,
the third incremental value possesses a third bit width,
the modulator possesses a second sample rate transducer,
the second intermediate signal is supplied to the second sample rate transducer with the first sample rate,
the second sample rate transducer outputs the second intermediate signal with the second sample rate,
the digital modulator possesses a fourth mixer stage,
the second intermediate signal and the second oscillator signal are supplied to the fourth mixer stage with the second sample rate, and
the fourth mixer stage mixes the second intermediate signal and the second oscillator signal into a second final signal and outputs the second final signal with the second sample rate.

Via this embodiment it is possible to realize a multichannel modulator whose individual channels can be modulated independent of one another, wherein a joint utilization of the second oscillator can nevertheless occur (to the extent that this is possible). The third oscillator frequency can hereby advantageously be set between the minimum frequency and the maximum frequency, and in fact with the same precision as the first oscillator frequency.

The second phase-amplitude transducer is advantageously designed as a look-up table whose output signal is determined by the output signal of the second phase accumulator acting on the phase-amplitude transducer. A determination of the respective amplitude value is possible in a simple and quick manner via this embodiment.

The latter cited procedure is particularly advantageous when the second mixer stage is designed as a single sideband mixer, the second oscillator signal comprises a sine signal and a cosine signal, and both the sine signal and the cosine signal are determined using the same look-up table.

An additional object is to achieve a modulator for radio-frequency signals that can be switched in a simple manner between different frequencies, wherein a phase relationship between the different oscillator signals can be maintained.

According to the preferred embodiment, the modulator is designed as an entirely digital modulator. It has a mixer stage to which a modulation signal and an oscillator signal are supplied with a sample rate. The mixer stage mixes the modulation signal and the oscillator signal into a final signal and outputs the final signal with a sample rate. The oscillator signal is generated by an oscillator that has at least two phase accumulators and one phase-amplitude transducer. The phase accumulators act in alternating fashion on the phase-amplitude transducer so that at most one of the phase accumulators acts on the phase-amplitude transducer at any point in time. The oscillator signal has an oscillator frequency that is determined by an incremental value by which the content of the phase accumulator acting on the phase-amplitude transducer is incremented between two readout processes in immediate succession.

Analogous to the first cited embodiment, the mixer stage is advantageously designed as a single sideband mixer, in particular as a switchable single sideband mixer. The advantages of this embodiment have already been mentioned in the preceding.

Furthermore, the oscillator frequency also normally lies in the multi-digit MHz range in this embodiment. The incremental values of the phase accumulators in this case advantageously have a bit width that is so large that the oscillator frequency can be adjusted by 1 Hz or even more precisely. The adjustability can in particular be so precise that the modulator is suitable for the generation of radio-frequency pulses for magnetic resonance applications.

In a particularly preferred embodiment, the mixer stage and the oscillator of the latter cited preferred embodiment correspond with the second mixer stage and the second oscillator of the first cited preferred embodiment.

The modulators according to the preferred embodiment are advantageously realized in at least one integrated circuit. For example, they can be realized in at least one programmable module that has a plurality of circuit blocks, wherein the circuit connections of the circuit blocks and/or the functionalities of the circuit blocks are determined by the programming of the module. Alternatively, the modulators can be realized in at least one ASIC.

Additional advantages and details result from the subsequent specification of exemplary embodiments in connection with the drawings.

According to FIG. 1, a modulator for radio-frequency signals has a pre-block 1 and a main block 2. The pre-block 1 is clocked with a first sample rate R1 of, for example, 8 MHz to 12 MHz; the main block 2 is clocked with a second sample rate R2. The term "clock with a sample rate" hereby means that input signals are input into the respective block 1, 2 and output signals are output from the respective block 1, 2.

The pre-block 1 has a first mixer stage 3. A first modulator signal M1 and a first oscillator signal O1 are supplied to the first mixer stage 3 (naturally with the first sample rate R1). The first mixer stage 3 mixes the first modulation signal M1 and the first oscillator signal O1 into a first intermediate signal Z1. It outputs the first intermediate signal Z1 (naturally likewise with the first sample rate R1).

The first oscillator signal O1 is generated by a first oscillator 4. For this purpose the first oscillator 4 has a first phase accumulator 5 and a first phase-amplitude transducer 6.

A first incremental value $\delta\phi1$ is supplied to the first phase accumulator 5 (with the first sample rate R1). The first incremental value $\delta\phi1$ has a first bit width b1 of, for example, 32 bits. The content of the first phase accumulator 5 is incremented by the first incremental value $\delta\phi1$ between two readout processes in immediate succession (thus with the first sample rate R1). Due to this circumstance, the first oscillator signal O1 has a first oscillator frequency f1 that is determined by the first incremental value $\delta\phi1$ under consideration of the first sample rate R1.

The first phase-amplitude transducer 6 converts the phase signal of the phase accumulator 5 into (at least) one amplitude value. The conversion normally occurs in a relatively precise manner, for example precisely at 12, 16 or 20 bits. In the individual cases, a more precise or rougher conversion can also occur. For example, the determination of the respective amplitude occurs according to what is known as the Cordic algorithm, which is generally known to experts.

It is possible to directly supply the first modulation signal M1 to the first mixer stage 3 with the first sample rate R1. However, the first modulation signal M1 is normally supplied to the first modulator with a low-frequency sample rate that, for example, is at maximum 1 MHz. In this case, a sample rate converter 7 that converts the modulation signal M1 into the first sample rate R1 is arranged before the first mixer stage 3.

As already mentioned, the first oscillator frequency f1 is determined by the first incremental value $\delta\phi1$. Depending on the first incremental value $\delta\phi1$, the first oscillator frequency f1 therefore varies between a minimum frequency fmin and a maximum frequency fmax. The maximum frequency fmax is hereby at maximum half as large as the first sample rate R1. For example, the maximum frequency fmax can be 2.5 MHz, the first sample rate R1 10 MHz.

Due to the first bit width b1 of (for example) 32 bits, the first bit width b1 is so large that the first oscillator frequency f1 can be adjusted by 1 Hz (and even more precisely). In particular, the first oscillator frequency f1 is so precisely adjustable that the modulator from FIG. 1 is suitable for the generation of radio-frequency pulses for magnetic resonance applications.

The output signal of the first mixer stage 3 (thus the first intermediate signal Z1) is supplied to a first sample rate transducer 8, and in fact (naturally) with the first sample rate R1. The first sample rate transducer 8 is hereby already an element of the main block 2. The first sample rate transducer 8 therefore outputs the first intermediate signal Z1 with the second sample rate R2. The second sample rate R2 is hereby significantly greater than the first sample rate R1. For example, it can lie between 60 MHz and 500 MHz, in particular at approximately 300 MHz.

The main block 2 has a second mixer stage 9. The first intermediate signal Z1 and a second oscillator signal O2 are supplied to the second mixer stage 9 with the second sample rate R2. The second mixer stage 9 mixes the first intermediate signal Z1 and the first oscillator signal O2 into a first final signal E1 and outputs the first final signal E1. The output of the first final signal naturally hereby occurs with the second sample rate R2.

The second oscillator signal O2 is generated by a second oscillator 10. For this purpose the second oscillator 10 has at least one second phase accumulator 11 and a second phase-amplitude transducer 12. However, only one of the second phase accumulators 11 acts on the phase-amplitude transducer 12 at any point in time, independent of the number of second phase accumulators 11.

The content of the second phase accumulator 11 acting on the phase amplitude transducer 12 is incremented by a second incremental value $\delta\phi2$ between two readout processes in immediate succession (thus with the second sample rate R2). The second oscillator signal O2 therefore possesses a second oscillator frequency f2 that is determined by the second incremental value $\delta\phi2$. The second oscillator frequency f2 is hereby greater than the first oscillator frequency f1.

The second incremental value $\delta\phi2$ has a second bit width b2. The second bit width b2 can be smaller than the first bit width b1. For example, it can be 7 or 8 bits. The second bit width is advantageously so large that the second oscillator frequency f2 can be adjusted in steps whose separation from one another is smaller than the maximum frequency fmax by which the first oscillator frequency f1 can be set. Independent of the adjustment precision of the second oscillator frequency f2, however, the second oscillator frequency f2 is normally in the multi-digit MHz range. For example, it can be varied in steps of 1 MHz, 2 MHz or 5 MHz between 30 MHz and 150 MHz.

The modulator from FIG. 1 is designed as an entirely digital modulator. All components 1 through 12 described in the preceding are therefore designed as digital components. Only the first final signal E1 is supplied to a converter block 13 that analogizes the first final signal E1. Filter components 14 can be arranged after the converter block 13 if necessary in order to produce a suitable filtering of the analogized signal. In the embodiment presented in FIG. 1, the converter block 13 and the filter components 14 are no longer components of the modulator from FIG. 1. However, in principle the converter block 13 and the filter components 14 could be components of the modulator from FIG. 1.

It is possible to design the modulator according to the preferred embodiment with discrete components 1 through 12 (or 13 or 14). However, it is preferable that the modulator is arranged in at least one integrated module. The integrated module can hereby be realized as a programmable module. In this case, the programmable module has a plurality of circuit blocks. The circuit connections of the circuit blocks and/or the functionalities of the circuit blocks are determined by a programming of the module. Such modules are generally known to experts. Examples of suitable modules are FPGAs, PLAs, PGAs and more of the like. Furthermore, it is possible to arrange the components 1 through 12 in an ASIC. In this case, the modulator is realized in an ASIC.

Independent of the concrete procedure that is taken—thus independent of whether the modulator is designed with discrete components, is realized in a programmable module or is realized in an ASIC—the modulator in its present, preferred embodiment is, however, designed as a modulator realized in circuits. The term "realized in circuits" hereby stands in contrast to a realization in software which contains the sequential execution of a program by a processor. Inasmuch as the required computing capacity is available, however, a realization in software is also possible.

Figure 2:
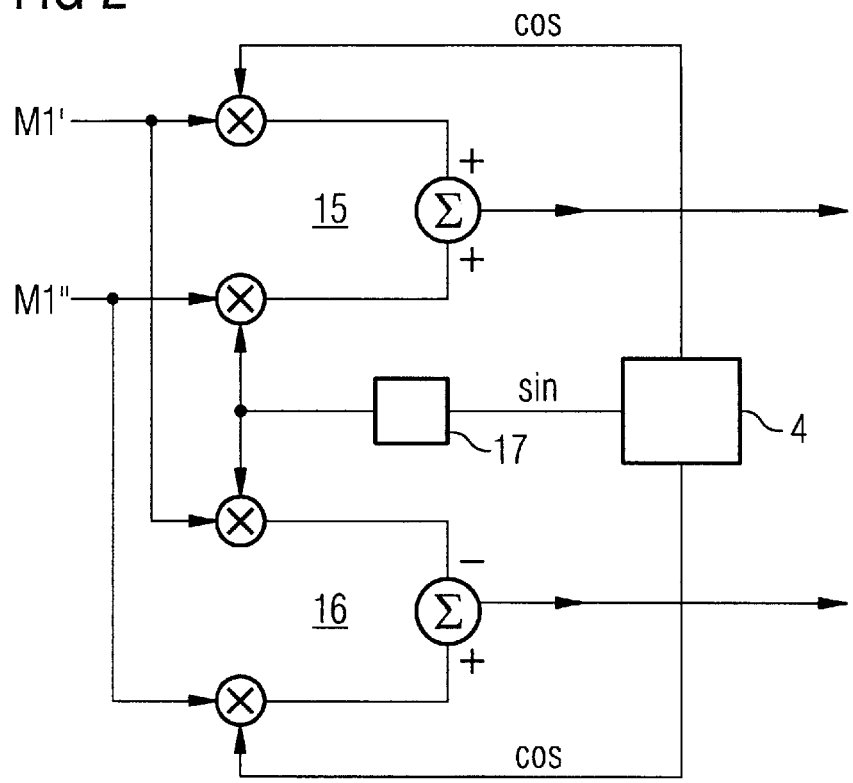
FIG. 2 shows one possible embodiment of a first mixer stage.

FIG. 2 shows one possible embodiment of the first mixer stage 3 from FIG. 1.

According to FIG. 2, the first mixer stage 3 is designed as a single sideband mixer. The first modulation signal M1 is therefore multiplied both with the sine signal of the first oscillator frequency f1 and with the cosine signal, and in fact in processing paths 15, 16 separate from one another. The term "oscillator signal" thus has (at least in the case of a single sideband mixing) the meaning that it comprises two individual signals phase-offset from one another by 90°, namely the sine signal and the cosine signal.

Due to the single sideband mixing, the single sideband mixer 3 generates only one signal that corresponds to the sum frequency of first oscillator frequency f1 and a modulation frequency of the first modulation signal M1 (normal position mixing) or only one signal that corresponds to the difference frequency of the last two cited frequencies (inverted position mixing).

The first mixer stage 3 advantageously has a change-over switch 17 by means of which the polarity sign of the signal supplied to the change-over switch 17 (here the sine signal) can be retained or inverted depending on the activation stage of the change-over switch 17. The single sideband mixer 3 is thereby designed as a switchable single sideband mixer. It is thus adjustable whether the single sideband mixer 3 conducts a normal position mixing or an inverted position mixing.

According to FIG. 2, it is even possible to design the first mixer stage 3 as a complex mixer stage 3. In this case it is possible that the first modulation signal M1 has a real part M1' and an imaginary part M1". The design and the processing of such mixer stages is generally known to experts, such that no additional explanations beyond the presentation of FIG. 2 are required.

The embodiment of the modulator according to FIG. 3 is a modification of the modulator from FIG. 1. The embodiment from FIG. 3 can be realized as an alternative or in addition to the embodiment of the first mixer stage 3 according to FIG. 2. Only the additional features are explained in connection with FIG. 3.

According to FIG. 3, multiple pre-blocks 1, 1', ... are present, thus at least two pre-blocks 1, 1'. Furthermore, multiple main blocks 2, 2', ... are present, namely one per pre-block 1, 1', ...

The pre-blocks 1, 1', ... are designed as this was described in the preceding for the pre-block 1 in connection with FIG. 1 (or FIG. 2). They are designed identically among one another, however can be operated independently of one another. Although their sample rate R1 is uniform, their incremental values $\delta\phi1$, $\delta\phi1'$, ... are individually adjustable. Different modulation signals M1, M2, ... can also be supplied to the pre-blocks 1, 1'.

The main blocks 2, 2', ... are designed from the outset as was explained in the preceding for the main block 2 from FIG. 1. However, a decisive difference exists in that the second oscillator 10 is present only a single time and is jointly used by all second mixer stages 9, 9', ...

Figure 4:
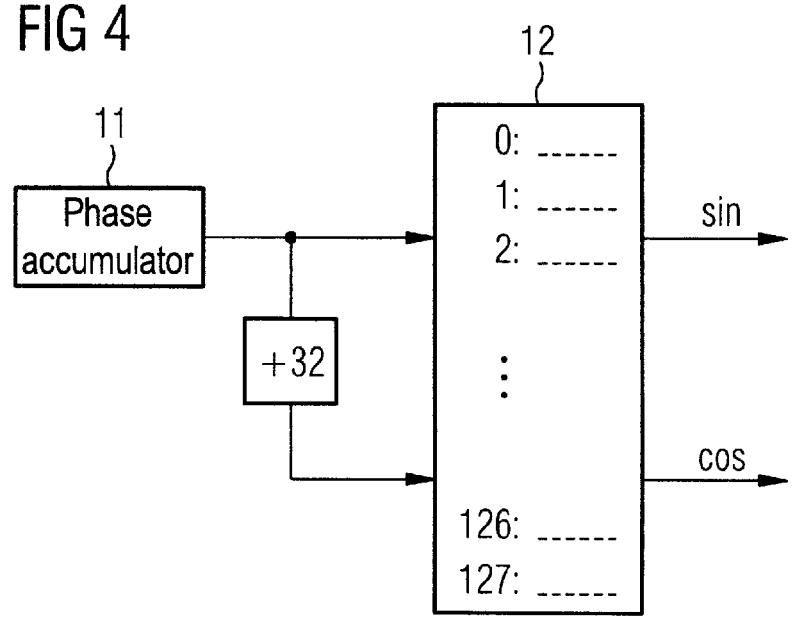
FIG. 4 shows one possible embodiment of a phase-amplitude transducer.

FIG. 4 shows a possible embodiment of the second phase-amplitude transducer 12 of FIGS. 1 and 3. According to FIG. 4, the second phase-amplitude transducer 12 is designed as a look-up table. The output signal of the phase accumulator 11 acting on the phase-amplitude transducer 12 is supplied to the look-up table 12. The output signal (of the corresponding second phase accumulator 11) supplied to the look-up table 12 determines which value is read out from the look-up table 12. It thus determines the output signal of the look-up table 12.

As already mentioned, the second incremental value $\delta\phi2$ has a relatively small bit width b2. The content of the at least one phase accumulator 11 can therefore be modified only in relatively rough steps. In contrast to this, the corresponding value itself is exact. It is therefore possible that the amplitude values stored in the look-up table 12 have a significantly larger bit width than the second bit width b2, for example 16, 18 or 20 bits.

According to FIG. 4, the second mixer stage 9 is also designed as a single sideband mixer. The second oscillator signal O2 therefore comprises both a sine signal and a cosine signal. In a preferred embodiment, both the sine signal and the cosine signal are determined using the same look-up table 12. The sine signal and the cosine signal are merely phase-offset by 90°, such that only two values phase-offset by 90° must be read out from one and the same (single-column) look-up table 12.

Figure 5:
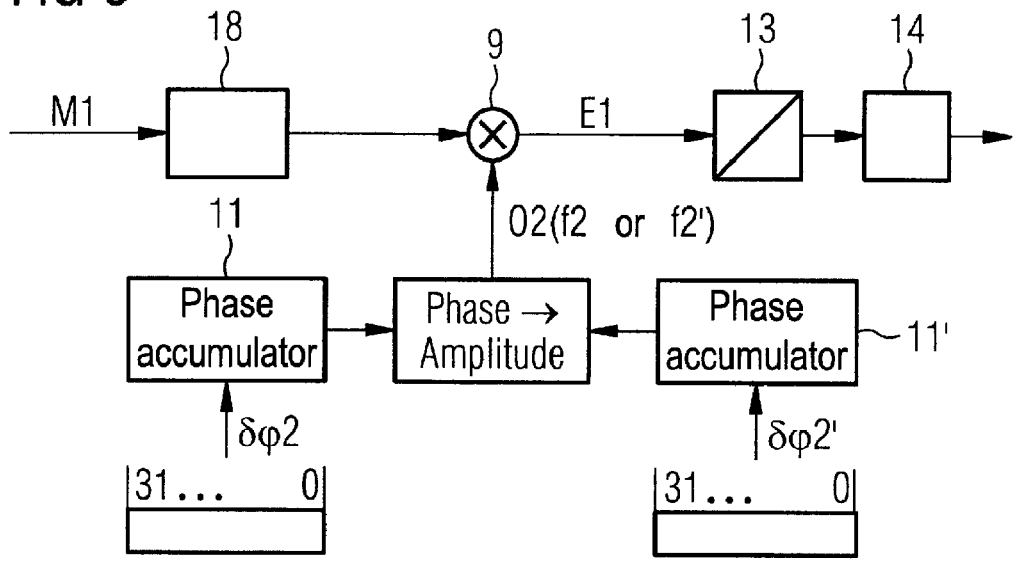
FIG. 5 shows schematically, an additional modulator according to one possible embodiment.
Figure 6:
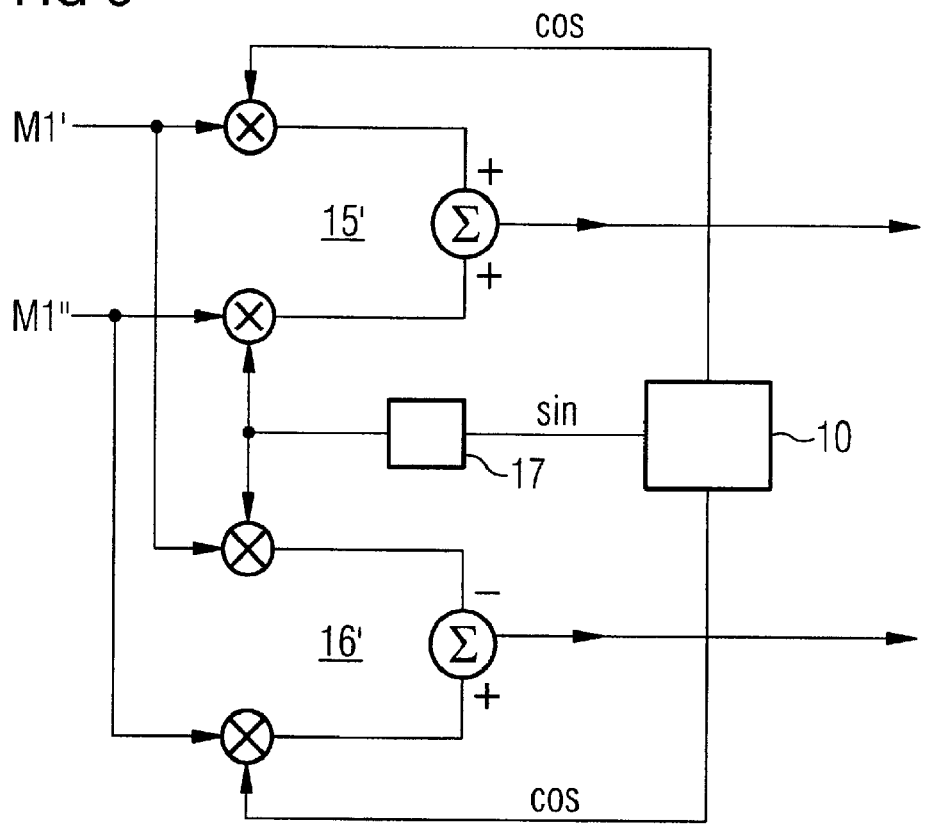
FIG. 6 shows one possible embodiment of a mixer stage of the modulator from FIG. 5.

In connection with FIG. 5, an additional inventive embodiment of a modulator is now explained. The modulator from FIG. 5 is also designed as an entirely digital modulator. Therefore (analogous to the embodiment from FIG. 1) it is also possible given this modulator that the modulator (analogous to the modulator from FIG. 1) is designed with discrete components, is realized in at least one programmable module or is realized in at least one ASIC. The above statements regarding FIG. 1 are analogously applicable in this regard.

The modulator from FIG. 5 corresponds in terms of its design to a large extent with the main block 2 from FIG. 1. Therefore, insofar as it is possible the corresponding reference characters of the main block 2 from FIG. 1 are used for the components of the modulator from FIG. 5. The explanations in this regard are also referenced.

The modulator from FIG. 5 significantly differs from the main block 2 of the modulator from FIG. 1 in two points.

On the one hand, at least two phase accumulators 11, 11' are present. The phase accumulators 11, 11' alternatively act on the phase-amplitude transducer 12. The term "alternatively" in this context means that at a maximum one of the phase accumulators 11, 11' acts on the phase-amplitude transducer 12 at any point in time. Which of the phase accumulators 11, 11' acts on the phase-amplitude transducer 12 at which point in time can be controlled.

The contents of the phase accumulators 11, 11' are independent of whether the respective phase accumulator 11, 11' is connected through to the phase-amplitude transducer 12 or not, incremented with the sample rate R2. They therefore exhibit a fixed phase relationship to one another. This fixed phase relationship applies independent of over which time period the contents of the phase accumulators 11, 11' are incremented.

As already mentioned, at most one of the phase accumulators 11, 11' acts on the phase-amplitude transducer 12. The incremental values $\delta\phi 2$, $\delta\phi 2'$ of the phase accumulators 11, 11' are, however, determinable independent from one another. The oscillator signal O2 therefore has an oscillator frequency f2 or f2'. The oscillator frequency f2 is hereby determined by the incremental value $\delta\phi 2$ by which the content of the phase accumulator 11 is incremented. The oscillator frequency f2 is determined by the incremental value $\delta\phi 2'$ by which the content of the phase accumulator 11' is incremented.

On the other hand, not an intermediate signal but rather a modulation signal M is supplied to the modulator from FIG. 5. The modulation signal M corresponds to the first modulation signal M1 from FIG. 1. Insofar as an initial sample rate conversion is hereby required, this ensues by means of a sample rate converter 18.

The oscillator frequency f2 or f2' should be in the multi-digit MHz range, as with the modulator from FIG. 1. However, it should be adjustable by 1 Hz or more precisely, analogous to the embodiment from FIG. 1 for the first oscillator frequency f1. In particular, it should be adjustable so precisely that the modulator from FIG. 5 is suitable for the generation of radio-frequency pulses of magnetic resonance applications. For this reason, the incremental values $\delta\phi 2$, $\delta\phi 2'$ must have bit widths b1 that are large enough. Normally, the bit width b2 will correspond with the first bit width b1 of the first incremental value $\delta\phi 1$ from FIG. 1, or even exceed this.

Analogous to the first mixer stage 3 (see FIG. 2), the mixer stage 9 of the modulator from FIG. 5 can be designed as a single sideband mixer. In particular, an embodiment as a switchable single sideband mixer is also possible. The corresponding circuit diagram is presented in FIG. 5, which corresponds in terms of its functionality to the design from FIG. 2, which is why the same reference characters (merely supplemented with an apostrophe) have been used.

The modulator according to the embodiment from FIG. 5 was explained with exactly two phase accumulators 11, 11'. However, the embodiment from FIG. 5 can be expanded without further techniques to 3, 4 or more phase accumulators 11, 11'.

Figure 7:
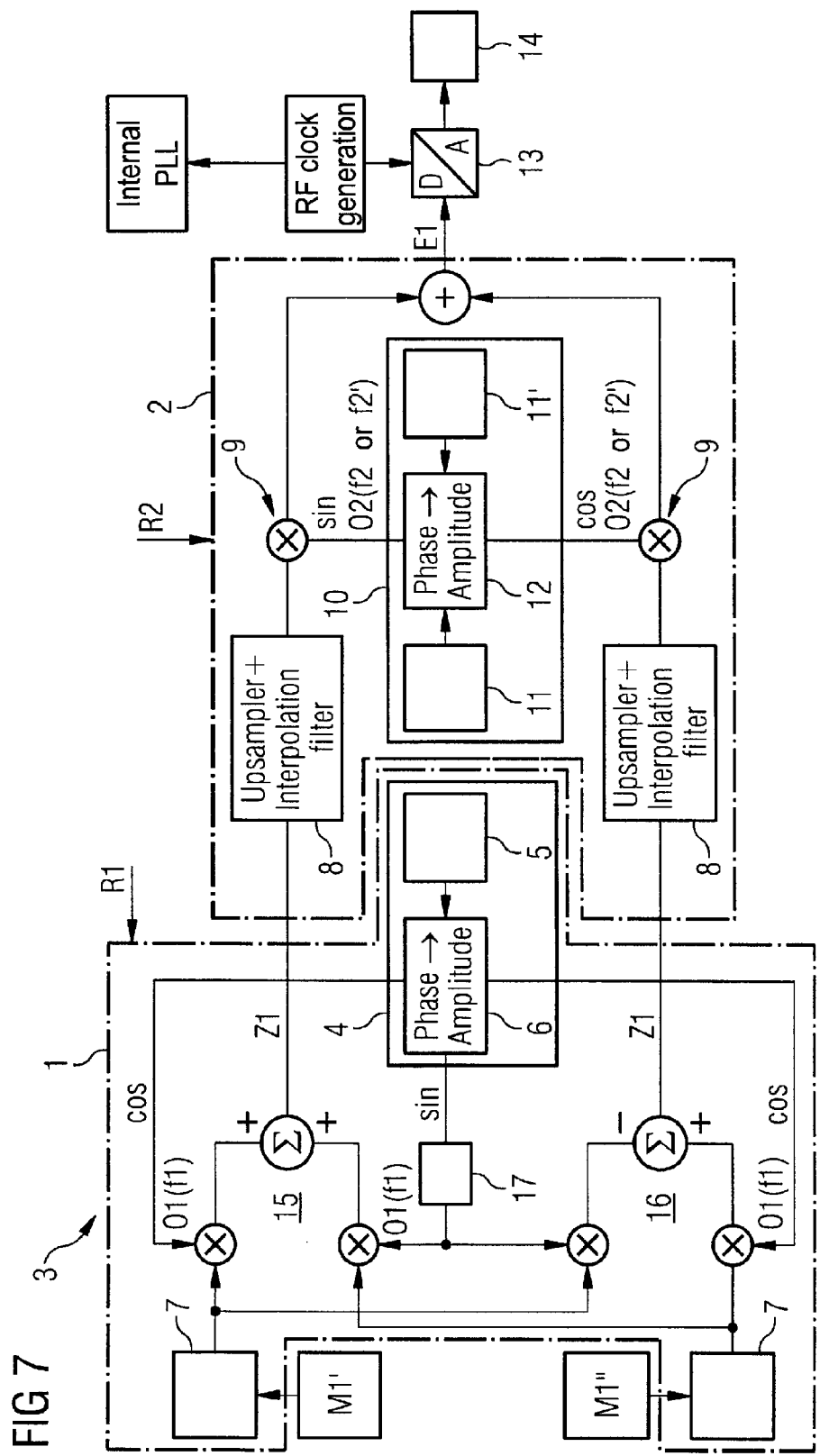
FIG. 7 shows one possible combination of the modulator from FIG. 1 and the modulator from FIG. 5.

FIG. 7 shows a combination of the modulators from FIG. 1 and FIG. 5. The presentation from FIG. 7 initially corresponds to the modulator from FIG. 1 (including its possible embodiments according to FIGS. 2 through 4). However, from FIG. 5 it is adopted that the second oscillator 10 has at least two second phase accumulators 11, 11', corresponding to the presentation from FIG. 5. Due to the fact that the first oscillator 4 is presented in the embodiment from FIG. 7, the first oscillator frequency f1 of which can be adjusted with high precision, the bit widths b2 of the second incremental values $\delta\phi 2$, $\delta\phi 2'$ in the embodiment according to FIG. 7 do not have be dimensioned so coarsely as in the embodiment from FIG. 5. Rather, the relatively small second bit width b2 according to the embodiment from FIG. 1 is sufficient.

The modulator from FIG. 7 is also advantageously realized in circuitry. Like the modulator from FIG. 1 or FIG. 5, it can alternatively be designed with discrete components, be realized in at least one programmable module or be realized in at least one ASIC.

The modulator according to the preferred embodiment has many advantages. In particular, it is possible with little effort to achieve a very good frequency precision and stability. However, in contrast to an analog solution, any compensation that would be required for sideband and carrier suppression is omitted, since the orthogonality is inherently ensured by the digital realization.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

We claim as our invention:

1. A modulator designed as a completely digital modulator for radio-frequency signals, comprising:
    a first mixer stage;
    a first modulation signal and a first oscillator signal supplied to the first mixer stage with a first sample rate;
    the first mixer stage mixing the first modulation signal and the first oscillator signal into a first intermediate signal and outputting the first intermediate signal with the first sample rate;
    the first oscillator signal being generated by a first oscillator;
    the first oscillator having a first phase accumulator and a phase-amplitude transducer;
    the first oscillator signal having a first oscillator frequency;
    the first oscillator frequency being determined by a first incremental value by which a content of the first phase accumulator is incremented between two readout processes in immediate succession;
    the first incremental value having a first bit width;
    the modulator has a first sample rate transducer;
    the first intermediate signal with the first sample rate being supplied to the first sample rate transducer;
    the first sample rate transducer outputting the first intermediate signal with a second sample rate that is greater than the first sample rate;
    the modulator having a second mixer stage;
    the first intermediate signal and a second oscillator signal being supplied to the second mixer stage with the second sample rate;
    the second mixer stage mixing the first intermediate signal and the second oscillator signal into a first final signal and outputting the first final signal with the second sample rate;
    the second oscillator signal being generated by a second oscillator;
    the second oscillator having at least one second phase accumulator and a second phase-amplitude transducer;
    only one of the phase accumulators acting on the phase-amplitude transducer;
    the second oscillator signal having a second oscillator frequency that is greater than the first oscillator frequency;
    the second oscillator frequency being determined by a second incremental value by which a content of the second phase accumulator acting on the phase-amplitude transducer is incremented between two readout processes in immediate succession; and
    the second incremental value having a second bit width that is smaller than the first bit width.

2. A modulator according to claim 1 wherein the first mixer stage is designed as a single sideband mixer.

3. A modulator according to claim 2 wherein the single sideband mixer is designed as a switchable single sideband mixer.

4. A modulator according to claim 1 wherein the second oscillator frequency is in the multi-digit MHZ range, and the first bit width is so large that the first oscillator frequency is adjustable by at least 1 Hz or more precisely.

5. A modulator according to claim 4 wherein the first oscillator frequency is so precisely adjustable that the modulator is suitable for the generation of radio-frequency pulses for magnetic resonance applications.

6. A modulator according to claim 1 wherein the first oscillator frequency is adjustable between a minimum frequency and a maximum frequency, and the second bit width is so large that the second oscillator frequency is adjustable in stages whose separation from one another is at maximum as large as the maximum frequency.

7. A modulator according to claim 1 wherein:
the modulator has a third mixer stage;
a second modulation signal and a third oscillator signal are supplied to the third mixer stage with the first sample rate;
the third mixer stage mixes the second modulation signal and the third oscillator signal into a second intermediate signal and outputs the second intermediate signal with the first sample rate;
the third oscillator signal is generated by a third oscillator;
the third oscillator has a third phase accumulator and a third phase-amplitude transducer;
the third oscillator signal has a third oscillator frequency;
the third oscillator frequency is determined by an incremental value by which a content of the third phase accumulator is incremented between two readout processes in immediate succession;
the third incremental value has a third bit width;
the modulator has a second sample rate transducer;
the second intermediate signal is supplied to the second sample rate transducer with the first sample rate;
the second sample rate transducer outputs the second intermediate signal with the second sample rate;
the digital modulator has a fourth mixer stage;
the second intermediate signal and the second oscillator signal are supplied to the fourth mixer stage with the second sample rate;
the fourth mixer stage mixes the second intermediate signal and the second oscillator signal into a second final signal and outputs the second final signal with the second sample rate.

8. A modulator according to claim 7 wherein the third oscillator frequency is adjusted between the minimum frequency and the maximum frequency, and the third oscillator frequency is adjusted with a same precision as the first oscillator frequency.

9. A modulator according to claim 1 wherein the second phase-amplitude transducer is designed as a look-up table whose output signal is determined by the output signal of the second phase accumulator acting on the phase-amplitude transducer.

10. A modulator according to claim 9 wherein the second mixer stage is designed as a single sideband mixer, the second oscillator signal comprises a sine signal and a cosine signal, and both the sine signal and the cosine signal are determined using the same look-up table.

11. A modulator according to claim 1 wherein it is realized in at least one integrated circuit.

12. A modulator according to claim 11 wherein the at least one integrated circuit is designed as a programmable module; the programmable module has a plurality of circuit blocks; and the circuit connections of the circuit blocks or functionalities of the circuit blocks are determined by a programming of the module.

13. A modulator according to claim 11 wherein the at least one integrated circuit is designed as an ASIC.

14. A modulator designed as an entirely digital modulator for radio-frequency signals, comprising:
a mixer stage to which a modulation signal and an oscillator signal are supplied with a sample rate;
the mixer stage mixing the modulation signal and the oscillator signal into a final signal and outputting the final signal with the sample rate;
the oscillator signal being generated by an oscillator;
the oscillator having at least two phase accumulators and one phase-amplitude transducer;
the phase accumulators acting in alternation on the phase-amplitude transducer so that at most one of the phase accumulators acts on the phase-amplitude transducer at any point in time;
the oscillator signal having an oscillator frequency; and
the oscillator frequency being determined by an incremental value by which a content of the phase accumulator acting on the phase-amplitude transducer is incremented between two readout processes in immediate succession.

15. A modulator according to claim 14 wherein the mixer stage is designed as a single sideband mixer.

16. A modulator according to claim 15 wherein the single sideband mixer is designed as a switchable single sideband mixer.

17. A modulator according to claim 14 wherein the oscillator frequency lies in the multi-digit MHz range, and incremental values of the phase accumulators have a bit width that is so large that the oscillator frequency can be adjusted by 1 Hz or even more precisely.

18. A modulator according to claim 17 wherein the oscillator frequency can be adjusted so precisely that the modulator is suitable for generation of radio-frequency pulses for magnetic resonance applications.

19. A modulator according to claim 14 wherein it is realized in at least one integrated circuit.

20. A modulator according to claim 19 wherein the at least one integrated circuit is designed as a programmable module; the programmable module having a plurality of circuit blocks; and the circuit connections of the circuit blocks or functionalities of the circuit blocks are determined by a programming of the module.

21. A modulator according to claim 19 wherein the at least one integrated circuit is designed as an ASIC.

22. A modulator designed as a digital modulator for radio-frequency signals, comprising:
a first mixer stage;
a first modulation signal and a first oscillator signal supplied to the first mixer stage with a first sample rate;
the first mixer stage mixing the first modulation signal and the first oscillator signal into a first intermediate signal and outputting the first intermediate signal with the first sample rate;
the first oscillator signal being generated by a first oscillator having a first phase accumulator and a phase-amplitude transducer, the first oscillator signal having a first oscillator frequency determined by a first incremental value by which a content of the first phase accumulator is incremented between readout processes;
the first incremental value having a first bit width;
the modulator has a first sample rate transducer;

the first intermediate signal with the first sample rate being supplied to the first sample rate transducer;

the first sample rate transducer outputting the first intermediate signal with a second sample rate that is greater than the first sample rate;

the modulator having a second mixer stage;

the first intermediate signal and a second oscillator signal being supplied to the second mixer stage with the second sample rate;

the second mixer stage mixing the first intermediate signal and the second oscillator signal into a first final signal and outputting the first final signal with the second sample rate;

the second oscillator signal being generated by a second oscillator having at least one second phase accumulator and a second phase-amplitude transducer;

one of the phase accumulators acting on the phase-amplitude transducer;

the second oscillator signal having a second oscillator frequency that is greater than the first oscillator frequency;

the second oscillator frequency being determined by a second incremental value by which a content of the second phase accumulator acting on the phase-amplitude transducer is incremented between readout processes; and the second incremental value having a second bit width that is smaller than the first bit width.

23. A modulator designed as a digital modulator for radio-frequency signals, comprising:

a mixer stage to which a modulation signal and an oscillator signal are supplied with a sample rate;

the mixer stage mixing the modulation signal and the oscillator signal into a final signal and outputting the final signal with the sample rate;

the oscillator signal being generated by an oscillator having at least two phase accumulators and one phase-amplitude transducer;

the phase accumulators acting on the phase-amplitude transducer so that at most one of the phase accumulators acts on the phase-amplitude transducer at any point in time; and the oscillator signal having an oscillator frequency determined by an incremental value by which a content of the phase accumulator acting on the phase-amplitude transducer is incremented between readout processes.

* * * * *